(12) United States Patent
Bai et al.

(10) Patent No.: US 11,307,502 B2
(45) Date of Patent: Apr. 19, 2022

(54) ASSISTANT PATTERN CONFIGURATION METHOD, MASK AND FORMING METHOD THEREOF, AND RELATED DEVICE

(71) Applicants: Semiconductor Manufacturing International (Shanghai) Corporation, Shanghai (CN); Semiconductor Manufacturing International (Beijing) Corporation, Beijing (CN)

(72) Inventors: Feng Bai, Shanghai (CN); Wanjuan Zhang, Shanghai (CN); Yibin Huang, Shanghai (CN); Yao Xu, Shanghai (CN); Fan Zhang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/952,245

(22) Filed: Nov. 19, 2020

(65) Prior Publication Data
US 2021/0271176 A1    Sep. 2, 2021

(30) Foreign Application Priority Data
Feb. 28, 2020   (CN) .......................... 202010130479.6

(51) Int. Cl.
*H01L 21/027* (2006.01)
*G03F 7/20* (2006.01)

(52) U.S. Cl.
CPC ...... *G03F 7/70641* (2013.01); *G03F 7/70625* (2013.01); *H01L 21/0274* (2013.01)

(58) Field of Classification Search
CPC ............ G03F 7/70641; G03F 7/70625; H01L 21/0274
(Continued)

(56) References Cited

U.S. PATENT DOCUMENTS

| 6,118,517 A * | 9/2000 | Sasaki | G03F 1/42 |
| | | | 355/53 |
| 7,245,351 B2 * | 7/2007 | Mattiza | G03F 9/7076 |
| | | | 355/53 |

(Continued)

*Primary Examiner* — Hung Nguyen
(74) *Attorney, Agent, or Firm* — Crowell & Moring LLP

(57) ABSTRACT

Embodiments and implementations of the present disclosure provide assistant pattern configuration methods, masks and forming methods thereof, and related devices. One form of a configuration method includes: providing a main pattern having an edge extending along a first direction, where a second direction is perpendicular to the first direction, the main pattern having a first optimal focal plane in the first direction and a second optimal focal plane in the second direction when exposed, and where there is an optimal focal plane offset between the first optimal focal plane and the second optimal focal plane; providing an initial assistant pattern around the main pattern; extracting a configuration parameter of the initial assistant pattern, the configuration parameter corresponding to the optimal focal plane offset; obtaining configuration information corresponding to a preset optimal focal plane offset based on an adjustment of the configuration parameter; and configuring an assistant pattern around the main pattern according to the configuration information. Embodiments and implementations of the present disclosure can improve lithographic quality.

18 Claims, 7 Drawing Sheets

(58) Field of Classification Search
USPC .................................................. 403/5, 20, 30
See application file for complete search history.

(56) References Cited

U.S. PATENT DOCUMENTS

| | | | |
|---|---|---|---|
| 2010/0183959 A1* | 7/2010 | Higaki | ..................... G03F 1/30 430/5 |
| 2016/0033880 A1* | 2/2016 | Kim | ......................... G03F 1/38 257/499 |
| 2018/0174839 A1* | 6/2018 | Lin | ..................... G03F 7/70441 |

* cited by examiner

8a

8b

9a

9b

ASSISTANT PATTERN CONFIGURATION METHOD, MASK AND FORMING METHOD THEREOF, AND RELATED DEVICE

RELATED APPLICATIONS

The present application claims priority to Chinese Patent Appln. No. 202010130479.6, filed on Feb. 28, 2020, the entire disclosure of which is hereby incorporated by reference.

BACKGROUND

Technical Field

Embodiments and implementations of the present disclosure relate to the field of semiconductor manufacturing, and in particular, to an assistant pattern configuration method, a mask and a forming method thereof, and a related device.

Related Art

Lithography is a critical technology in semiconductor manufacturing technologies. A pattern can be transferred from a mask to a surface of a silicon wafer through the lithography to form a semiconductor product that meets a design requirement. A lithography process includes an exposure step and a development step performed after the exposure step. In the exposure step, a light ray is irradiated onto a silicon wafer coated with photoresist through a light-transmitting region in the mask, and the photoresist undergoes a chemical reaction under the irradiation of the light ray. In the development step, a lithographic pattern is formed by utilizing a difference between the solubility of photo-sensitive photoresist and photo-insensitive photoresist to develop and transfer a pattern from the mask to the photoresist. After the lithography process is performed, an etching step is usually further performed, that is, the silicon wafer is etched based on the lithographic pattern formed by a photoresist layer, and the pattern on the mask is transferred to the silicon wafer.

In semiconductor manufacturing, as a design size of semiconductors continues shrinking towards the limit of a lithographic imaging system, and a light diffraction effect is more obvious. As a result, an optical image of a design pattern is eventually degraded, the actual lithographic pattern is severely distorted relative to the pattern on the mask, and the actual pattern formed on the silicon wafer through lithography is different from the design pattern. This phenomenon is referred to as an optical proximity effect (OPE). Sub-resolution assist features, optical proximity correction (OPC), inverse lithography technology (ILT), double patterning (DP), self-aligned double patterning (SADP), and other technical methods are used to improve lithographic resolution.

A scattering bar (SB or Sbar) is a sub-resolution assistant pattern, and an assistant pattern is disposed around a main pattern to improve lithographic quality of the main pattern. The main pattern is an exposure pattern, and the scattering bar is usually a non-exposure pattern.

SUMMARY

To address these problems, embodiments and implementations of the present disclosure provide an assistant pattern configuration method, a mask and a forming method thereof, and a related device, to improve lithographic quality of a main pattern.

One form of the present disclosure provides an assistant pattern configuration method, including: providing a main pattern having an edge extending along a first direction, where a second direction is perpendicular to the first direction, the main pattern having a first optimal focal plane in the first direction and a second optimal focal plane in the second direction when exposed, where there is an optimal focal plane offset between the first optimal focal plane and the second optimal focal plane; providing an initial assistant pattern around the main pattern; extracting a configuration parameter of the initial assistant pattern, the configuration parameter corresponding to the optimal focal plane offset; obtaining configuration information corresponding to a preset optimal focal plane offset based on an adjustment of the configuration parameter; and configuring an assistant pattern around the main pattern according to the configuration information.

In some implementations, the configuration parameter includes at least one of a size of the initial assistant pattern or a distance between the initial assistant pattern and the main pattern.

In some implementations, the initial assistant pattern includes a first initial assistant pattern and a second initial assistant pattern, where an aspect ratio of the second initial assistant pattern is different from an aspect ratio of the first initial assistant pattern.

In some implementations, the configuration parameter includes at least one of the aspect ratio of the first initial assistant pattern, the aspect ratio of the second initial assistant pattern, or a ratio of a quantity of first initial assistant patterns to a quantity of second initial assistant patterns.

In some implementations, the configuration parameter includes at least one of a width of the first initial assistant pattern, a length of the first initial assistant pattern, a spacing between adjacent first initial assistant patterns, a distance between the first initial assistant pattern and the main pattern, a width of the second initial assistant pattern, a length of the second initial assistant pattern, a distance between the second initial assistant pattern and the main pattern, a spacing between adjacent second initial assistant patterns, or a ratio of a quantity of first initial assistant patterns to a quantity of second initial assistant patterns.

In some implementations, the first initial assistant pattern is a square, and the second initial assistant pattern is a rectangle.

In some implementations, the step of providing an initial assistant pattern around the main pattern includes: sequentially configuring at least one set of initial assistant patterns from the main pattern as a center to a periphery, the set of initial assistant patterns including a first initial assistant pattern and a second initial assistant pattern located outside the first initial assistant pattern.

In some implementations, the first initial assistant pattern and the second initial assistant pattern are arranged at intervals.

In some implementations, the main pattern is a bar-shaped main pattern, and the bar-shaped main pattern has first configuration information of an assistant pattern along the first direction; and the bar-shaped main pattern has second configuration information of an assistant pattern along the second direction, the second configuration information being different from the first configuration information.

In some implementations, the initial assistant pattern is provided around the main pattern through modeling; and the configuration parameter is adjusted by changing data in a model to obtain configuration information.

In some implementations, the step of providing an initial assistant pattern around the main pattern includes: providing a mask, the mask including the main pattern and the assistant pattern around the main pattern; and the configuration parameter is adjusted by using a lithographic pattern formed by performing lithography through the mask to obtain configuration information.

In some implementations, the assistant pattern is a scattering bar.

Another form of the present disclosure further provides a mask forming method, including: providing a chip design pattern, the chip design pattern including a plurality of types of main patterns; configuring an assistant pattern for each type of main pattern using the configuration method to obtain assistant pattern configuration information corresponding to each type of main pattern; providing a chip mask including at least one type of main pattern; and configuring an assistant pattern for the main pattern on the mask according to assistant pattern configuration information corresponding to the main pattern.

In some implementations, in the step of obtaining the assistant pattern configuration information corresponding to each type of main pattern, an assistant pattern configuration parameter corresponding to each type of main pattern is summarized into a table; and an assistant pattern configuration parameter corresponding to the main pattern on the mask is obtained through table lookup according to the assistant pattern configuration information corresponding to the main pattern.

In some implementations, the main pattern includes a one-dimensional main pattern, a rectangular main pattern, or a square main pattern.

Another form of the present disclosure provides a mask, including a plurality of types of main patterns and an assistant pattern around the main pattern, the assistant pattern being obtained using the configuration method.

Yet another form of the present disclosure provides a device, including at least one memory and at least one processor, the memory storing one or more computer instructions that when executed by the at least one processor, cause the processor to implement the configuration method.

A further form of the present disclosure provides a storage medium, where the storage medium stores one or more computer instructions, the one or more computer instructions being used to implement the configuration method.

Compared with the prior art, technical solutions of embodiments and implementations of the present disclosure have the following advantages:

In assistant pattern configuration methods provided in embodiments and implementations of the present disclosure, the initial assistant pattern is first configured around the main pattern; the configuration parameter of the initial assistant pattern is extracted, the configuration parameter corresponding to an offset between the optimal focal plane in the first direction (for example, a horizontal direction parallel to the side) and the optimal focal plane in the second direction (for example: a vertical direction perpendicular to the side); the optimal focal plane offset is adjusted by adjusting the configuration parameter to conform to a preset specification; and then the assistant pattern is configured around the main pattern according to configuration information corresponding to the preset optimal focal plane offset. In this way, when the main pattern provided with the assistant pattern is exposed, the offset between the optimal focal plane in the first direction and the optimal focal plane in the second direction is relatively small. Therefore, a process window of an exposure process is increased, and lithographic quality of the main pattern is improved.

DETAILED DESCRIPTION

It can be learned from the background that disposing a sub-resolution assistant pattern (for example, a scattering bar, Sbar) around a main pattern of a mask is one of common-used resolution enhancement technologies to improve lithographic quality of the main pattern.

With the development of lithography, an incident ray is exposed by using an incident ray at a specified angle to a surface of a substrate. In such lithography, imaging quality of a pattern on a mask is not high. In particular, patterns along different directions have different imaging quality when a same exposure step is performed.

A one-dimensional (1D) pattern is taken as an example to analyze reasons for the foregoing problem.

Figure 1:
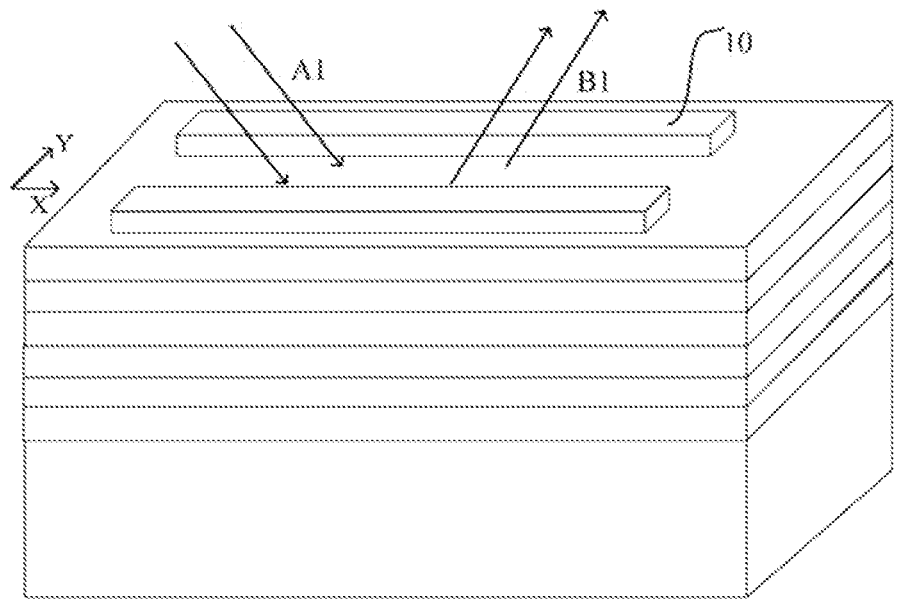
FIG. 1 and FIG. 2 are respectively schematic diagrams of optical paths of 1D scattering bars disposed along different directions.
Figure 2:
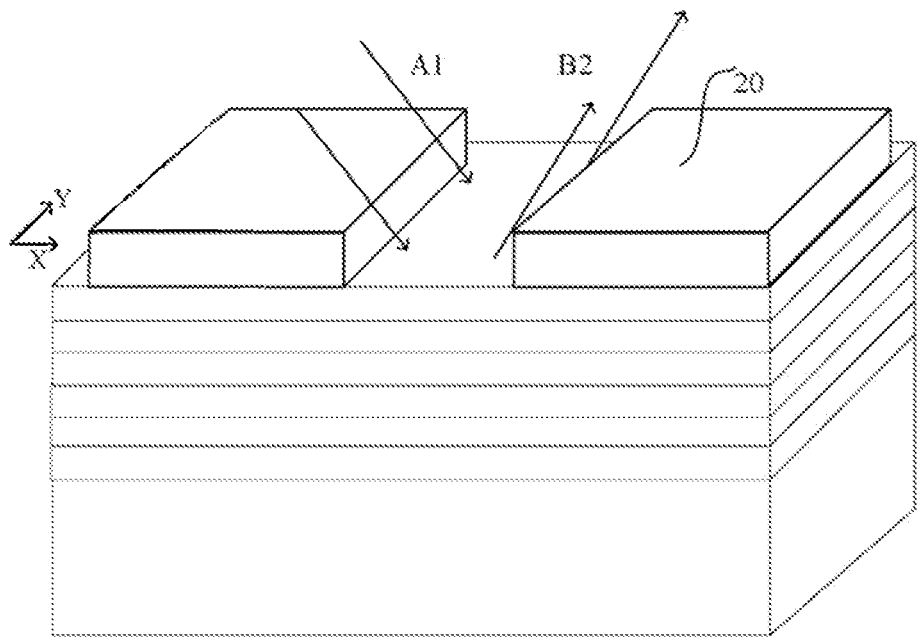

FIG. 1 and FIG. 2 are schematic diagrams of optical paths of 1D patterns disposed along different directions. A coordinate system is established based on a plane of a substrate, including an X axis and a Y axis perpendicular to the X axis.

As shown in FIG. 1, a 1D main pattern on the substrate extends along the X-axis direction, and an incident ray A1 is incident on the substrate at a specified incident angle and forms a first reflected ray B1.

As shown in FIG. 2, when the main pattern on the substrate is exposed by using the incident ray A1 at the same incident angle along the Y-axis direction, because the 1D pattern extends along the Y axis, the 1D pattern is likely to block the incident ray A1 in the X direction when the incident ray A1 is obliquely incident at a specified incident angle, to form a second reflected ray B2.

It can be learned that even if the same 1D pattern is disposed on the substrate along different directions, there is a large deviation in an exposure light path, and accordingly a position of the mask for exposure imaging also varies. In particular, a Common DOF is too small when a lithography machine exposes 1D patterns disposed on the substrate in different directions, and optimal focal planes of the mask have a large deviation in different directions. In other words, there is a large optimal focal plane offset.

To address the technical problem, one form of the present disclosure provides an assistant pattern configuration method, including: providing a main pattern having an edge extending along a first direction, where a second direction is perpendicular to the first direction, the main pattern having a first optimal focal plane in the first direction and a second optimal focal plane in the second direction when exposed, and where there is an optimal focal plane offset between the first optimal focal plane and the second optimal focal plane; providing an initial assistant pattern around the main pattern; extracting a configuration parameter of the initial assistant pattern, the configuration parameter corresponding to the optimal focal plane offset; obtaining configuration information corresponding to a preset optimal focal plane offset based on an adjustment of the configuration parameter; and configuring an assistant pattern around the main pattern according to the configuration information.

In some implementations, the initial assistant pattern is first configured around the main pattern; the configuration parameter of the initial assistant pattern is extracted, the configuration parameter corresponding to an offset between the optimal focal plane in the first direction (for example, a horizontal direction parallel to the side) and the optimal focal plane in the second direction (for example: a vertical direction perpendicular to the side); the optimal focal plane offset is adjusted by adjusting the configuration parameter to conform to a preset specification; and then the assistant pattern is configured around the main pattern according to configuration information corresponding to the preset optimal focal plane offset. In this way, when the main pattern provided with the assistant pattern is exposed, the offset between the optimal focal plane in the first direction and the optimal focal plane in the second direction is relatively small. Therefore, a process window of an exposure process is increased, and lithographic quality of the main pattern is improved.

Figure 3:
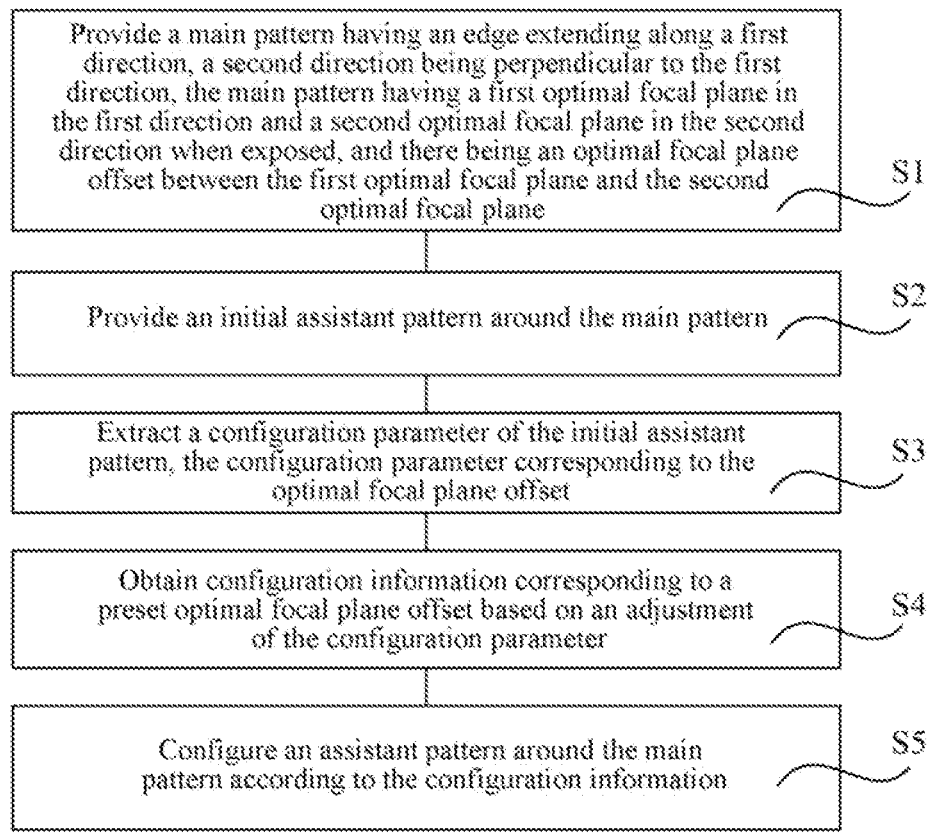
FIG. 3 is a schematic flowchart of an assistant pattern configuration method according to one form of the present disclosure.

FIG. 3 is a schematic flowchart of an assistant pattern configuration method according to one form of the present disclosure. The assistant pattern configuration method includes the following steps:

Step S1: Provide a main pattern having an edge extending along a first direction, where a second direction is perpendicular to the first direction, the main pattern having a first optimal focal plane in the first direction and a second optimal focal plane in the second direction when exposed, and where there is an optimal focal plane offset between the first optimal focal plane and the second optimal focal plane.

Step S2: Provide an initial assistant pattern around the main pattern.

Step S3: Extract a configuration parameter of the initial assistant pattern, the configuration parameter corresponding to the optimal focal plane offset.

Step S4: Obtain configuration information corresponding to a preset optimal focal plane offset based on an adjustment of the configuration parameter.

Step S5: Configure an assistant pattern around the main pattern according to the configuration information.

In order to make the foregoing objectives, features, and advantages of the embodiments and implementations of the present disclosure more apparent and easier to understand, specific embodiments and implementations of the present disclosure are described in detail below with reference to the accompanying drawings.

With reference to FIG. 3, step S1 is performed to provide the main pattern.

A chip pattern includes a plurality of basic patterns, and common basic patterns include a one-dimensional (1D) pattern, a rectangle, or a square.

The 1D pattern includes a 1D polygonal pattern and a 1D space pattern, the 1D space pattern being a narrow pattern formed between patterns.

In addition, the basic pattern further includes a head-to-head (HTH) pattern. For example, short sides of adjacent rectangular patterns are opposite to form an HTH pattern.

When a sub-resolution assistant pattern is disposed, the basic pattern is a main pattern.

Figure 4:
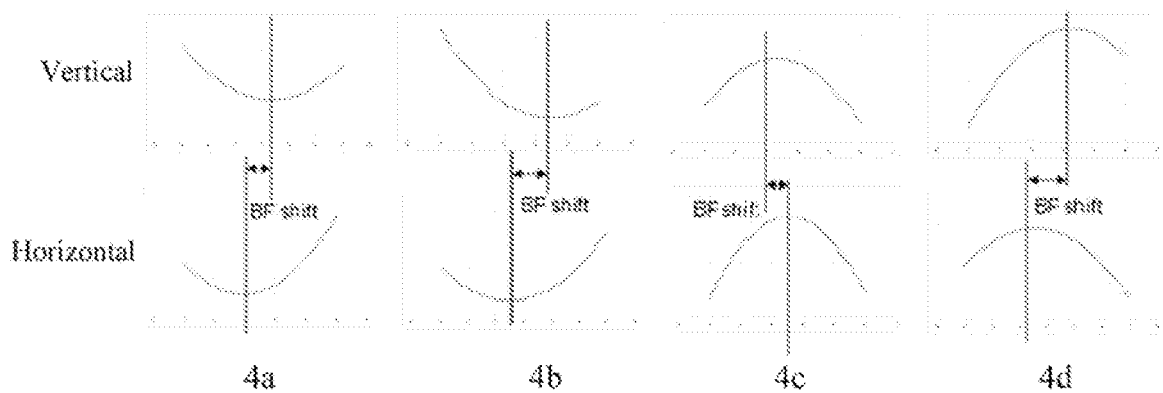
FIG. 4 is a schematic diagram of optimal focal planes of a plurality of types of main patterns in vertical and horizontal directions.

When a mask is exposed, patterns on the mask in different directions have different optimal focal planes. FIG. 4 is a schematic diagram of optimal focal planes of different shapes of main patterns in vertical and horizontal directions.

In particular, FIG. 4a illustrates a location of an optimal focal plane of a head-to-head (HTH) main pattern. FIG. 4b illustrates a location of an optimal focal plane of a 1D polygonal main pattern. FIG. 4c illustrates a location of an optimal focal plane of a 1D space main pattern. FIG. 4d illustrates a location of an optimal focal plane of a rectangular main pattern.

The horizontal direction in FIG. 4a to FIG. 4d means that a direction along which a pattern extends is horizontal, for example, a direction of a long side of a 1D pattern or a rectangle is horizontal. The vertical direction means a direction perpendicular to the horizontal direction.

In data corresponding to the head-to-head main pattern, the 1D polygonal main pattern, and the rectangular main pattern respectively corresponding to FIG. 4a, FIG. 4b, and FIG. 4d, a location of an optimal focal plane of a pattern in a horizontal direction is shifted leftward to some degree relative to a location of an optimal focal plane of a pattern in a vertical direction (herein, "left" refers to a left direction facing FIG. 4). In 1D space data corresponding to FIG. 4c, a location of an optimal focal plane of a pattern in a horizontal direction is shifted rightward relative to a location of an optimal focal plane of a pattern in a vertical direction (herein, "right" refers to a right direction facing FIG. 4).

It can be learned that the main pattern has the edge extending along the first direction (a horizontal direction), the second direction (a vertical direction) is perpendicular to the first direction, the main pattern has the first optimal focal plane in the first direction and the second optimal focal plane in the second direction when exposed, and there is an optimal focal plane offset between the first optimal focal plane and the second optimal focal plane.

Step S2 is performed to provide the initial assistant pattern around the main pattern.

In some implementations of the present disclosure, quality of a pattern formed through exposure is optimized by disposing an assistant pattern (that is, a scattering bar) around the main pattern. The main pattern is a to-be-exposed pattern, and a scattering bar pattern is usually not exposed but is used to optimize the exposed pattern, so that the pattern formed through exposure is more consistent with a shape of the main pattern.

At present, a method for disposing a scattering bar includes a rule-based SRAF disposing method. In the method, based on an empirical rule, the scattering bar is first disposed around the main pattern, that is, a width of the scattering bar and a distance between the scattering bar and the main pattern are set according to an empirical initial configuration rule and with reference to a feature size and a spacing of the main pattern.

In some implementations, the initial assistant pattern is provided around the main pattern through modelling. For example, in a process of simulating the main pattern and exposure of the main pattern by using a model, the initial assistant pattern is disposed around the main pattern through simulation, and when a configuration parameter is subsequently adjusted, an entire exposure process is also simulated.

In other embodiments and implementations, a pre-set assistant pattern may be formed around the main pattern on the mask through a process. Subsequently, exposure may be performed through the mask with the pre-set assistant pattern, and a configuration parameter is adjusted based on a lithographic pattern formed through a lithographic process to obtain configuration information.

Figure 5:
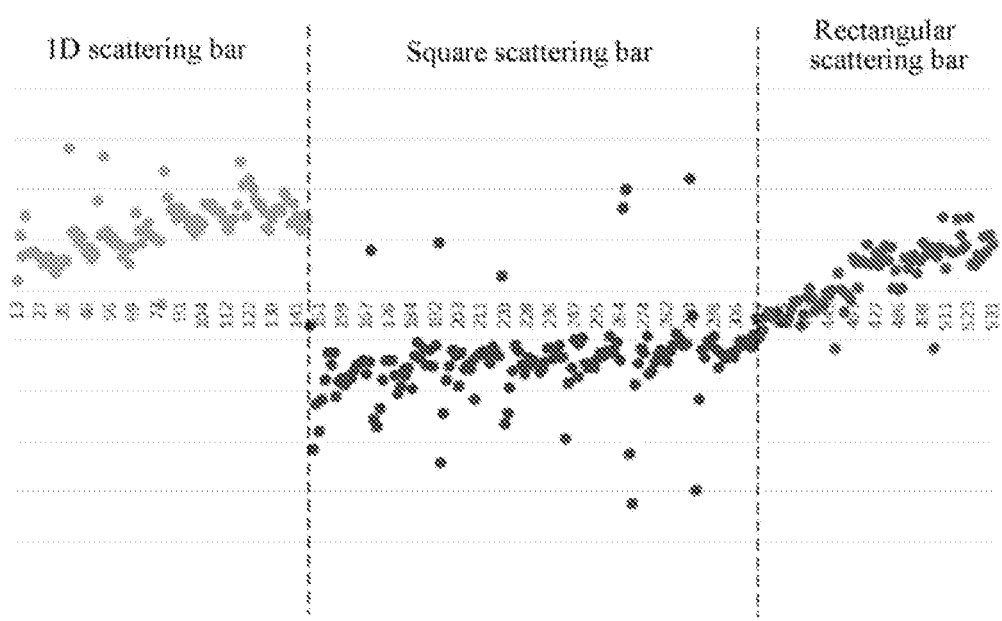
FIG. 5 is a statistical diagram of optimal focal plane offsets of a plurality of scattering bars.

FIG. 5 is a statistical diagram of optimal focal plane offsets of different scattering bars. Three regions in FIG. 5 respectively illustrate distribution of optimal focal plane offsets of a 1D scattering bar, a square scattering bar, and a rectangular scattering bar. In particular, a difference between an optimal focal plane in a horizontal direction and an optimal focal plane in a vertical direction is used as an optimal focal plane offset, and each point in the statistical diagram indicates a magnitude of an optimal focal plane offset for a corresponding shape.

As shown in FIG. 5, an absolute value of an optimal focal plane offset of the 1D scattering bar is greater than that of the rectangular scattering bar in a positive direction.

In some implementations, in the step of providing an initial assistant pattern around the main pattern, the initial assistant pattern includes a first initial assistant pattern and a second initial assistant pattern, an aspect ratio of the second initial assistant pattern being different from an aspect ratio of the first initial assistant pattern. For example, the first initial assistant pattern is a square, and the second initial assistant pattern is a rectangle.

In some implementations, in the step of configuring assistant patterns from the main pattern as a center to a periphery, at least one set of initial assistant patterns are sequentially configured, where the set of initial assistant patterns includes a first initial assistant pattern and a second initial assistant pattern that is located outside of the first initial assistant pattern.

That is, initial assistant patterns appear in pairs during configuration, so that a first initial assistant pattern and a second assistant pattern in a group of assistant patterns can be more finely adjusted.

Step S3 is performed to extract the configuration parameter of the initial assistant pattern, the configuration parameter corresponding to the optimal focal plane offset.

It should be noted that the correspondence herein means that the configuration parameter is related to the optimal focal plane offset. Changing the configuration parameter may change the optimal focal plane offset accordingly.

As shown in FIG. 5, if a scattering bar is longer, an optimal focal plane is more likely to be deviated toward the positive direction. That is, a shape of the scattering bar is related to an offset of the optimal focal plane. A configuration parameter of the scattering bar can be quantified through extraction, so that the offset of the optimal focal plane can be changed.

For example, the configuration parameter includes one or two of a size of the initial assistant pattern and a distance between the initial assistant pattern and the main pattern.

Referring to FIG. 5 again, most data points of the 1D scattering bar and the rectangular scattering bar fall into an interval in which the optimal focal plane offset is positive, and most data points of the square scattering bar fall into an interval in which the optimal focal plane offset is negative.

It can be learned that different shapes of scattering bars may be configured around the main pattern to adjust an optimal focal plane.

In some implementations in which different sizes of initial assistant patterns are disposed, an optimal focal plane offset of the main pattern may be adjusted by adjusting sizes of the initial assistant patterns and a quantity ratio of assistant patterns. For example, the configuration parameter includes one or more of the aspect ratios of the first initial assistant pattern, the aspect ratio of the second initial assistant pattern, or a ratio of a quantity of first initial assistant patterns to a quantity of second initial assistant patterns.

Figure 6:
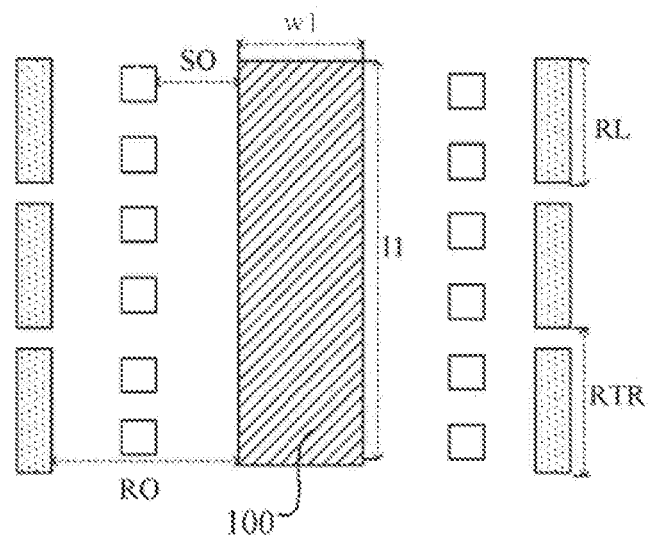
FIG. 6 and FIG. 7 are respectively schematic diagrams of assistant patterns preset around a 1D main pattern and a rectangular main pattern.
Figure 7:
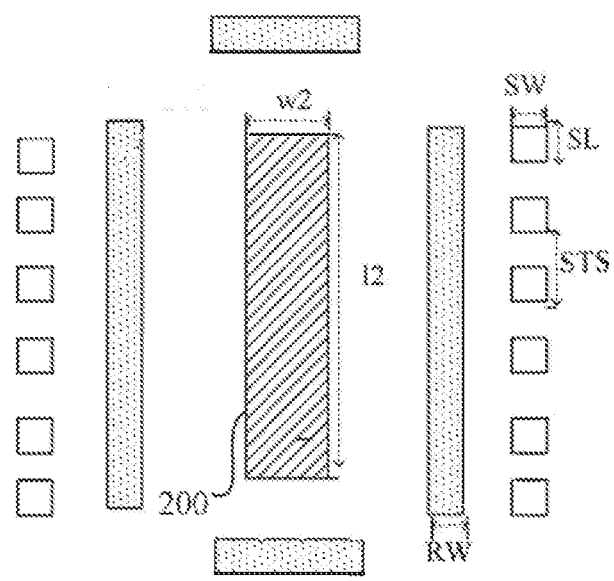

FIG. 6 and FIG. 7 are respectively schematic diagrams of assistant patterns pre-set around a 1D main pattern and a rectangular main pattern.

In some implementations, a length l1 of a 1D pattern 100 is much greater than a width w1, and therefore the 1D pattern 100 may be classified into a category of 1D pattern. A ratio of a length l2 to a width w2 of a rectangle 200 is less than a ratio of the length l1 to the width w1 of the 1D pattern 100, and therefore the rectangle 200 cannot be classified into the category of 1D patterns, but is classified into a category of rectangular main patterns.

In some implementations, the first initial assistant pattern is a square, and the second initial assistant pattern is a rectangle.

In particular, in the step of extracting a configuration parameter of an assistant pattern, the configuration parameter includes:

one or more of a width SW of the first initial assistant pattern, a length SL of the first initial assistant pattern, a spacing STS between adjacent first initial assistant patterns, a distance SO between the first initial assistant pattern and the main pattern, a width RW of the second initial assistant pattern, a length RL of the second initial assistant pattern, a distance RO between the second initial assistant pattern and the main pattern, a spacing RTR between adjacent second initial assistant patterns, and a ratio R of a quantity of first initial assistant patterns to a quantity of second initial assistant patterns.

In some implementations, the first initial assistant pattern is a square, and therefore SL and SW are equal. For a 1D main pattern, a rectangular main pattern, and a square main pattern, the following formula may be used to express a correspondence between a configuration parameter and an optimal focal plane offset.

$$BF = \sum_{1}^{3} BF_i(SO_i, RO_i, SW_i, STS_i, RW_i, RL_i, RTR_i, R_i)$$

BF1 represents an optimal focal plane offset of the 1D main pattern, BF2 represents an optimal focal plane offset of the rectangular main pattern, and BF3 represents an optimal focal plane offset of the square main pattern.

Step S4 is performed to obtain the configuration information corresponding to the pre-set optimal focal plane offset based on then adjustment of the configuration parameter.

In order to reduce the optimal focal plane offset, the configuration parameter may be adjusted so that the optimal focal plane offset approaches 0. When a pre-set specification value of the optimal focal plane offset is reached (that is, a smaller optimal focal plane offset that meets a design specification), the configuration information corresponding to the configuration parameter may be determined as a configuration scheme of the assistant pattern.

For example, the pre-set specification value is $10^{-5}$ to $10^{-1}$.

Specifically, a parameter adjustment direction may be determined based on previously accumulated data (such as data shown in FIG. 5). For example, an optimal focal plane offset after adding an initial pre-set assistant pattern is negative. As shown in FIG. 5, the optimal focal plane offset corresponding to the rectangular assistant pattern is positive, and the optimal focal plane offset corresponding to the square assistant pattern is negative. The ratio of the quantity of rectangular assistant patterns to the quantity of square assistant patterns may be increased, so that the optimal focal plane offset corresponding to the main pattern can be finally adjusted toward a positive direction.

In some implementations of the present disclosure, an assistant pattern is configured through modelling, and a configuration parameter may be adjusted by changing data in a model to obtain configuration information.

In particular, the content of "obtaining the configuration information corresponding to the pre-set optimal focal plane offset based on the adjustment of the configuration parameter" may be expressed by the following formula:

$$\frac{\partial S}{\partial P} = 0, \text{ where } S = BF_H - BF_V.$$

In other words, different configuration parameters are adjusted to obtain an optimal solution of the optimal focal plane offset. The optimal solution herein means that the optimal focal plane offset is 0 or infinitely close to 0.

Actually, a node for adjusting the configuration parameter may be determined by setting a value of the pre-set optimal focal plane offset.

It should be noted that during the adjustment of the configuration parameter, the following condition |SO−RO|>2 max(SWLW) needs to be met. That is, the first initial assistant pattern and the second initial assistant pattern are arranged at intervals with a specified space between each other, to keep the assistant patterns from overlapping and maintain integrity of each assistant pattern.

In other embodiments and implementations in which an assistant pattern is configured using a specific process, the step of providing an initial assistant pattern around the main pattern may include: providing a mask including the main pattern and the assistant pattern around the main pattern; where the configuration parameter is adjusted using a lithographic pattern formed by performing lithography through the mask. That is, a result actually detected by the process is fed back to the configuration of the assistant pattern on the mask, and an optimal focal plane offset during exposure through the mask is reduced by continuously adjusting the assistant pattern on the mask.

Step S5 is performed to configure the assistant pattern around the main pattern according to the configuration information.

Figure 8:
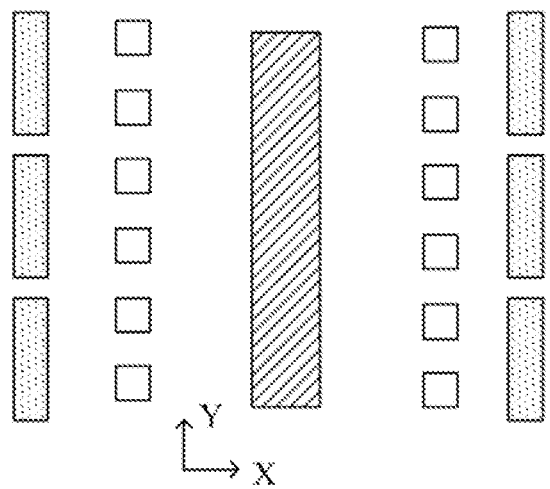
FIG. 8 is a schematic diagram of configuration information of assistant patterns of a 1D main pattern along Y and X directions.
Figure 8:
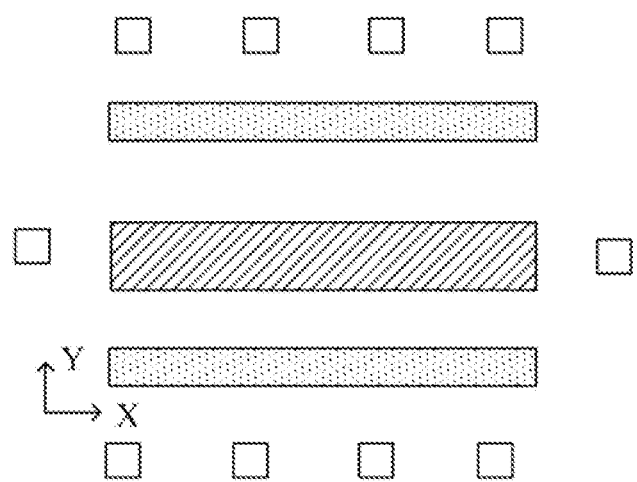

FIG. 8*a* and FIG. 8*b* are respectively schematic diagrams of configuration information of assistant patterns of a 1D main pattern along Y and X directions.

As shown in FIG. 8*a*, first configuration information of the 1D main pattern extending along the Y direction includes: assistant patterns disposed on both sides of the 1D main pattern, a list of square assistant patterns adjacent to the 1D main pattern, and a list of rectangular assistant patterns next-adjacent to the 1D main pattern.

As shown in FIG. 8*b*, second configuration information of the 1D main pattern extending along the X direction includes: assistant patterns disposed on both sides of the 1D main pattern, a list of rectangular assistant patterns adjacent to the 1D main pattern, and a list of square assistant patterns next-adjacent to the 1D main pattern. The second configuration information of the 1D main pattern extending in the X direction further includes square assistant patterns at both ends of the 1D main pattern.

It can be learned that, the first configuration information and the second configuration information are different when the same 1D main pattern is disposed in different directions.

Differences in the configuration information further includes: an arrangement layout of an assistant pattern, a size of an assistant pattern, a ratio of a quantity of rectangular assistant patterns and square assistant patterns, and the like.

Figure 9:
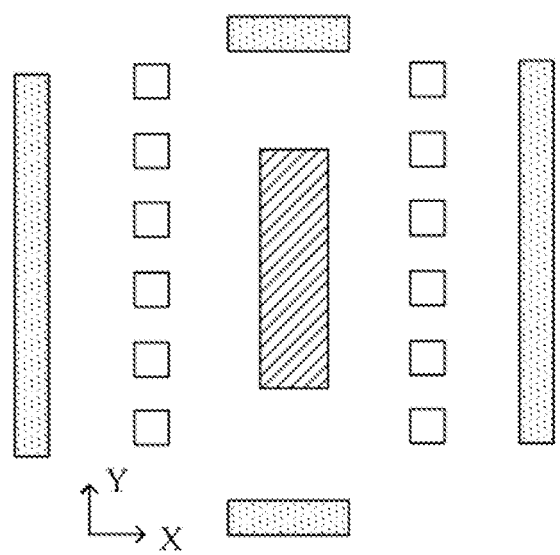
FIG. 9 is a schematic diagram of configuration information of assistant patterns of a rectangular main pattern along Y and X directions.
Figure 9:
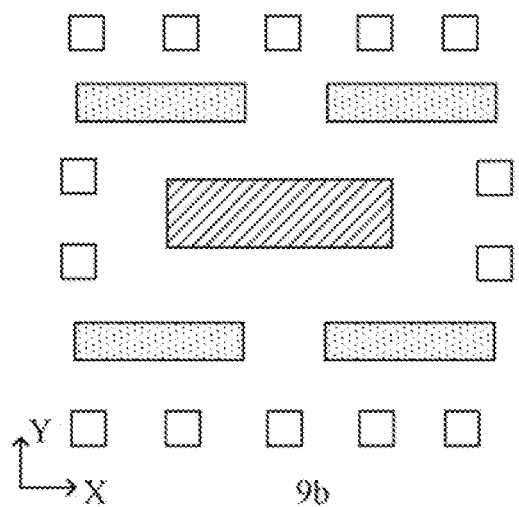

FIG. 9*a* and FIG. 9*b* are respectively schematic diagrams of configuration information of assistant patterns of a rectangular main pattern along Y and X directions.

As shown in FIG. 9*a*, first configuration information of the rectangular main pattern extending along the Y direction includes: assistant patterns disposed on both sides of the rectangular main pattern, a list of square assistant patterns adjacent to the rectangular main pattern, and a list of rectangular assistant patterns next-adjacent to the rectangular main pattern. In addition, a rectangular assistant pattern is disposed on each of short sides of the rectangular main pattern.

As shown in FIG. 9*b*, second configuration information of the rectangular main pattern extending along the X direction includes: assistant patterns disposed on both sides of the rectangular main pattern, a list of rectangular assistant patterns adjacent to the 1D main pattern, and a list of square assistant patterns next-adjacent to the 1D main pattern. The second configuration information of the rectangular main pattern extending in the X direction further includes two square assistant patterns disposed on each of the short sides of the rectangular main pattern.

It can be learned that, the first configuration information and the second configuration information are different when the same rectangular main pattern is disposed in different directions.

Because a bar-shaped main pattern is greatly affected by an oblique incident light source, configuration information set around the bar-shaped main pattern in different directions is different. By disposing different assistant patterns (scattering bars), the main pattern can maintain pattern consistency in different directions after lithography, thereby improving quality of a lithographic process.

Another form of the present disclosure further provides a mask forming method, including: providing a chip design pattern, the chip design pattern including a plurality of types of main patterns; configuring an assistant pattern for each type of main pattern to obtain assistant pattern configuration information corresponding to each type of main pattern; providing a chip mask including at least one type of main pattern; and configuring an assistant pattern for the main pattern on the mask according to assistant pattern configuration information corresponding to the main pattern.

In the step of providing the chip design pattern, all main patterns included in the design pattern may be configured with assistant patterns, and the assistant pattern configuration information corresponding to each type of main pattern may be obtained. The main pattern includes the following categories: a one-dimensional main pattern, a rectangular main pattern, or a square main pattern.

In this way, when a mask of an actual chip is obtained, corresponding configuration information is extracted for the main pattern on the mask, to add an assistant pattern to the main pattern on the mask, thereby improving image quality during exposure of the pattern on the mask.

It should be noted that when an assistant pattern is configured for a main pattern of the chip design pattern, an assistant pattern configuration parameter corresponding to each type of main pattern is summarized into a table. In this way, for the main pattern on the mask, an assistant pattern configuration parameter corresponding to the main pattern on the mask may be obtained through table lookup. Table lookup is more clear and convenient, so that the assistant pattern configuration parameter can be quickly obtained, thereby improving process efficiency.

Correspondingly, the present disclosure further provides a mask, including a plurality of types of main patterns and an assistant pattern around the main pattern, the assistant pattern being obtained by using the configuration method.

The mask is used to expose photoresist on a wafer to form a photoresist pattern of each chip region on the wafer. The chip region of the wafer can be etched by using the photoresist pattern to form a gate electrode, a metal interconnection line, or a conductive plug temple semiconductor structure in the chip region of the wafer.

It can be learned from the foregoing embodiment and implementations that after the assistant pattern is configured using the foregoing embodiment, an optimal focal plane offset of a same main pattern in horizontal and vertical directions is relatively small, and a common focal depth of the same main pattern in both directions is relatively large. Therefore, when by using the mask plate according to the embodiments and implementations of the present disclosure, when lithography is performed by using the mask in the present embodiments and implementations of the present disclosure, a common process window of a lithography process is maximized, and accuracy of pattern transfer is correspondingly improved.

One form of the present disclosure further provides a device, and the device can perform the above-mentioned assistant pattern configuration method in a manner of loading a program.

Figure 10:
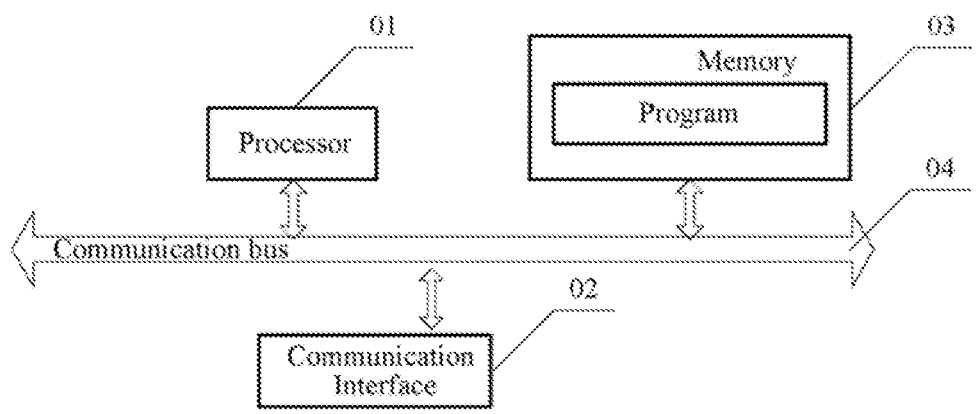
FIG. 10 is a hardware structural diagram of a device according to one form of the present disclosure.

An optional hardware structure of a terminal device provided in one form of the present disclosure may be shown in FIG. 10, including: at least one processor 01, at least one communications interface 02, at least one memory 03, and at least one communications bus 04.

In some implementations of the present disclosure, a quantity of each of the processor 01, the communications interface 02, the memory 03, and the communications bus 04 is at least one, and communication among the processor 01, the communications interface 02, and the memory 03 is implemented by using the communications bus 04.

The communications interface 02 may be an interface of a communication module for network communication, for example, an interface of a GSM module.

The processor 01 may be a central processing unit (CPU) or an application-specific integrated circuit (ASIC), or may be configured as one or more integrated circuits for implementing the embodiments and implementations of the present disclosure.

The memory 03 may include a high-speed RAM memory, or may further include a non-volatile memory, for example, at least one magnetic disk memory.

The memory 03 stores one or more computer instructions, and the one or more computer instructions are executed by the processor 01 to implement the assistant pattern configuration method in the embodiment of the present disclosure.

It should be noted that the foregoing terminal device for implementation may further include other devices (not shown) which may not be necessary for the disclosure of the embodiments and implementations of the present disclosure. Because these other devices may not be necessary for understanding the disclosure of the embodiments and implementations of the present disclosure, they are not introduced one by one in the embodiments and implementations of the present disclosure.

One form of the present disclosure further provides a storage medium, where the storage medium stores one or more computer instructions, and the one or more computer instructions are used to implement the assistant pattern configuration method provided in the embodiment of the present disclosure.

The implementations of the present disclosure described above are a combination of elements and features of the present disclosure. The elements or features may be considered selective unless otherwise mentioned. Each element or feature may be practiced without being combined with other elements or features. In addition, the implementations of the present disclosure may be configured by combining part of elements and/or features. The order of operations described in the implementations of the present disclosure may be rearranged. Some configurations of any implementation may be included in another implementation and may be replaced with corresponding configurations of another implementation. It is obvious to a person skilled in the art that claims in the appended claims that do not have a clear reference relationship with each other may be combined into an implementation of the present disclosure, or may be included as new claims in amendments after the filing of this application.

The implementations of the present disclosure can be implemented by various means such as hardware, firmware, software, or a combination thereof. In a hardware configuration mode, the method according to the exemplary embodiments and implementations of the present disclosure may be implemented by one or more application specific integrated circuits (ASICs), digital signal processors (DSPs), digital signal processing devices (DSPDs), programmable logic devices (PLD), field programmable gate arrays (FPGAs), processors, controllers, microcontrollers, microprocessors, and the like.

In a firmware or software configuration mode, the implementations of the present disclosure may be implemented in the form of modules, processes, functions, and the like. Software code may be stored in a memory unit and executed by a processor. The memory unit is located inside or outside the processor and can send data to and receive data from the processor by various known means.

The foregoing descriptions of the disclosed embodiments and implementations enable a person skilled in the art to implement or use the present disclosure. Various modifications to these embodiments and implementations are obvious to a person skilled in the art, and the general principles defined in the present disclosure may be implemented in other embodiments and implementations without departing from the spirit and scope of the present disclosure. Therefore, the present disclosure is not limited to these embodiments and implementations illustrated in the present disclosure, but needs to conform to the broadest scope consistent with the principles and novel features disclosed in the present disclosure.

Although the present disclosure has been disclosed above, the present disclosure is not limited thereto. A person skilled in the art may make variations and modifications without departing from the spirit and scope of the present disclosure. Therefore, the protection scope of the present disclosure should be subject to the appended claims.

What is claimed is:

1. An assistant pattern configuration method, comprising:
providing a main pattern having an edge extending along a first direction, where a second direction is perpendicular to the first direction, the main pattern having a first focal plane in the first direction and a second focal plane in the second direction when exposed, and where there is a focal plane offset between the first focal plane and the second focal plane;
providing an initial assistant pattern around the main pattern;
extracting a configuration parameter of the initial assistant pattern, where the configuration parameter corresponds to the focal plane offset;
obtaining configuration information corresponding to a preset focal plane offset based on an adjustment of the configuration parameter; and
configuring an assistant pattern around the main pattern according to the configuration information.

2. The configuration method according to claim 1, wherein the configuration parameter comprises at least one of a size of the initial assistant pattern or a distance between the initial assistant pattern and the main pattern.

3. The configuration method according to claim 1, wherein the initial assistant pattern comprises a first initial assistant pattern and a second initial assistant pattern, where an aspect ratio of the second initial assistant pattern is different from an aspect ratio of the first initial assistant pattern.

4. The configuration method according to claim 3, wherein the configuration parameter comprises at least one of the aspect ratio of the first initial assistant pattern, the aspect ratio of the second initial assistant pattern, or a ratio of a quantity of first initial assistant patterns to a quantity of second initial assistant patterns.

5. The configuration method according to claim 3, wherein the configuration parameter comprises at least one of:
a width of the first initial assistant pattern,
a length of the first initial assistant pattern,
a spacing between adjacent first initial assistant patterns,
a distance between the first initial assistant pattern and the main pattern,
a width of the second initial assistant pattern,
a length of the second initial assistant pattern,
a distance between the second initial assistant pattern and the main pattern,
a spacing between adjacent second initial assistant patterns, or
a ratio of a quantity of first initial assistant patterns to a quantity of second initial assistant patterns.

6. The configuration method according to claim 3, wherein the first initial assistant pattern is a square, and the second initial assistant pattern is a rectangle.

7. The configuration method according to claim 3, wherein:
the step of providing an initial assistant pattern around the main pattern comprises: sequentially configuring at least one set of initial assistant patterns from the main pattern as a center to a periphery, and
the set of initial assistant patterns comprises a first initial assistant pattern and a second initial assistant pattern located outside the first initial assistant pattern.

8. The configuration method according to claim 3, wherein the first initial assistant pattern and the second initial assistant pattern are arranged at intervals.

9. The configuration method according to claim 1, wherein:
the main pattern is a bar-shaped main pattern, and the bar-shaped main pattern has first configuration information of an assistant pattern along the first direction;
the bar-shaped main pattern has second configuration information of an assistant pattern along the second direction, and
the second configuration information is different from the first configuration information.

10. The configuration method according to claim 1, wherein:
the initial assistant pattern is provided around the main pattern through modeling; and
the configuration parameter is adjusted by changing data in a model to obtain configuration information.

11. The configuration method according to claim 1, wherein:
the step of providing an initial assistant pattern around the main pattern comprises: providing a mask comprising the main pattern and the assistant pattern around the main pattern; and
the configuration parameter is adjusted using a lithographic pattern formed by performing lithography through the mask to obtain configuration information.

12. The configuration method according to claim 1, wherein the assistant pattern is a scattering bar.

13. A mask forming method, comprising:
providing a chip design pattern comprising a plurality of types of main patterns;
configuring an assistant pattern for each type of main pattern of the plurality of types of main patterns using the configuration method according to claim 1 to obtain assistant pattern configuration information corresponding to each type of main pattern;
providing a chip mask comprising at least one type of main pattern; and
configuring an assistant pattern for the main pattern on the mask according to assistant pattern configuration information corresponding to the main pattern.

14. The forming method according to claim 13, wherein:
in the step of obtaining the assistant pattern configuration information corresponding to each type of main pattern, an assistant pattern configuration parameter corresponding to each type of main pattern is summarized into a table; and
an assistant pattern configuration parameter corresponding to the main pattern on the mask is obtained through table lookup according to the assistant pattern configuration information corresponding to the main pattern.

15. The forming method according to claim 13, wherein the main pattern comprises a one-dimensional main pattern, a rectangular main pattern, or a square main pattern.

16. A mask, comprising a plurality of types of main patterns and an assistant pattern around the main pattern, wherein the assistant pattern is obtained using the configuration method of claim 1.

17. A device, comprising:
  at least one memory configured to store one or more computer instructions; and
  at least one processor configured to execute the one or more computer instructions stored in the memory to implement the configuration method according to claim 1.

18. A non-transitory storage medium configured to store one or more computer instructions, wherein the one or more computer instructions when executed by a processor, directed to processor to implement the configuration method according to claim 1.

* * * * *